(12) United States Patent
Lu et al.

(10) Patent No.: US 7,074,527 B2
(45) Date of Patent: Jul. 11, 2006

(54) METHOD FOR FABRICATING A MASK USING A HARDMASK AND METHOD FOR MAKING A SEMICONDUCTOR DEVICE USING THE SAME

(75) Inventors: Bing Lu, Gilbert, AZ (US); James R. Wasson, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 252 days.

(21) Appl. No.: 10/668,432

(22) Filed: Sep. 23, 2003

(65) Prior Publication Data

US 2005/0064299 A1    Mar. 24, 2005

(51) Int. Cl.
*G01F 9/00* (2006.01)
(52) U.S. Cl. .......................................................... 430/5
(58) Field of Classification Search .................... 430/5, 430/312, 313
See application file for complete search history.

(56) References Cited

U.S. PATENT DOCUMENTS

| | | | |
|---|---|---|---|
| 6,121,123 A | 9/2000 | Lyons | |
| 6,297,170 B1 | 10/2001 | Gabriel | |
| 6,573,167 B1 | 6/2003 | Xing | |
| 6,596,465 B1 | 7/2003 | Mangat | |
| 6,653,053 B1 * | 11/2003 | Mangat et al. | 430/311 |
| 6,777,340 B1 * | 8/2004 | Chiu et al. | 438/700 |
| 6,872,497 B1 * | 3/2005 | Levinson et al. | 430/5 |
| 6,887,783 B1 * | 5/2005 | Chen et al. | 438/631 |
| 6,908,716 B1 * | 6/2005 | Chan | 430/5 |
| 2003/0031936 A1 | 2/2003 | Mangat | |

FOREIGN PATENT DOCUMENTS

WO    WO 02/073682 A1    9/2002

OTHER PUBLICATIONS

Lercel et al., "Etching Processes and Characteristics for the Fabrication of Refractory X-ray Masks," 1998 American Vacuum Society, J. Vac. Sci. Technol. B 16(6), Nov./Dec. 1998, pp. 3577-3581.

Brooks et al., "Characterization of Oxynitride Hardmask Removal Processes for Refractory X-ray Mask Fabrication," SPIE vol. 3331, pp. 255-260 (1998).

Dauksher et al., "Uniform Low Stress Oxynitride Films for Application as Hardmasks on X-ray Masks," 1997 American Vacuum Society, J. Vac. Sci. Technol. B 15(6), Nov./Dec. 1997, pp. 2232-2237.

* cited by examiner

*Primary Examiner*—S. Rosasco
(74) *Attorney, Agent, or Firm*—Kim-Marie Vo

(57) ABSTRACT

A bilayer hardmask 26 is used to manufacture a mask 10, which can be implemented to pattern a resist 165 on a semiconductor wafer 150. In one embodiment, the bilayer hardmask 26 has two layers: a first hardmask layer 28 and a second hardmask layer 30. The first hardmask layer 28 may be carbon and can be etched selective to the overlying second hardmask layer 30 and an underlying absorber structure 20. In one embodiment, the second hardmask layer 30 is a transparent layer of SiON, SiN, or $SiO_2$. The bilayer hardmask 26 allows for a thinner resist to be used during fabrication of the mask 10.

20 Claims, 4 Drawing Sheets

METHOD FOR FABRICATING A MASK USING A HARDMASK AND METHOD FOR MAKING A SEMICONDUCTOR DEVICE USING THE SAME

FIELD OF THE INVENTION

This invention relates generally to a mask used for patterning layers of integrated circuits, and more specifically, to a method for making a mask using a bilayer hardmask that can be used to form a semiconductor device.

BACKGROUND

Semiconductor devices are made using lithographic techniques. Current lithography process uses photons to transfer the device images on a mask (reticle) to a layer of photosensitive material, such as a photoresist, formed on a semiconductor wafer. As dimensions of semiconductor devices continue to shrink to sub-0.1 µm, new techniques, such as 193 nm and extreme ultraviolet (EUV) lithography as well as phase shift masks, are needed to meet manufacturing requirements. However, etch selectivity between photoresist and an underlying absorber structure of a mask, in which a pattern is being formed, is poor. Portions of the photoresist are removed while etching the absorber structure rendering the pattern in the absorber structure to be different than that desired.

To accommodate for the photoresist removal during the etch process a thick photoresist, which is approximately 300 to 400 nanometers, is used. While a thick photoresist may be suitable for some applications, it makes it difficult to pattern high resolution features due to their high aspect ratio and may lead to the photoresist collapsing. Additionally, when using a thick photoresist non-volatile etch by-products may deposit on features patterned in the thick photoresist to form "veils", which are very difficult to remove. Thus, a need exists for a method to form high aspect ratio features when etching an absorber structure as part of a mask fabrication process.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
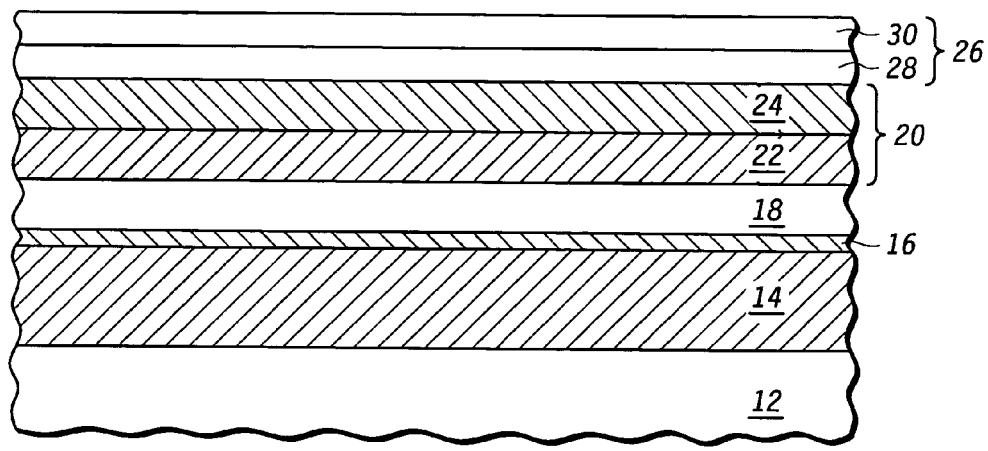
FIG. 1 illustrates a cross-section of a portion of a mask having multiple layers including a bilayer hardmask as in accordance with an embodiment of the present invention.

Shown in FIG. 1 is the starting point for forming a mask (reticle), which includes a mask substrate 12, a reflective layer 14, an etch stop layer (ESL) 16, a (repair) buffer layer 18, an absorber structure 20 and a bilayer hardmask 26. The mask substrate 12 is a low thermal expansion (LTE) material, which as used herein has a coefficient of thermal expansion (CTE) of less than approximately 30 part per billion (ppb) per degree Kelvin at +/-22 degrees Celsius; a low defect density, which used herein is approximately less than 0 defects greater than approximately 50 nanometers Poly-Styrene Latex (PSL) sphere equivalent and low surface roughness, which used herein is less than approximately 50 nanometers peak to valley flatness. In addition, the mask substrate 12 should be able to mechanically support any overlying layers during the manufacturing process of the mask and the fabrication process of the semiconductor device. In one embodiment, the mask substrate can be a high-quality silica, such as ULE® zero expansion glass provided by Corning.

In one embodiment, the reflective layer 14 formed over the mask substrate 12 is a multi-layer stack and, preferably, comprises a stack of 40-layer pairs of silicon and molybdenum layers with a periodicity of about 7 nm, wherein a molybdenum layer is in contact with the mask surface and a silicon layer is the top layer of the reflective layer 14. Other materials, however, may be used. Ion beam deposition (IBD), magnetron sputtering, E-beam evaporation or the like can be used to deposit the silicon and molybdenum multi-layer stack. Optionally, a capping layer of a reflective material can be formed over the reflective layer 14.

Formed over the reflective layer 14, the ESL 16, in one embodiment, is approximately 10 nanometers of chromium (Cr) or chrome. The buffer layer 18 is formed over the ESL 16. In one embodiment, the buffer layer 18 includes silicon and oxygen, or more specifically, is a silicon oxynitride deposited by plasma enhanced chemical vapor deposition (PECVD). The buffer layer 18 may be approximately 30–90 nanometers thick.

In the embodiment illustrated in FIG. 1, the absorber structure 20, which is formed over the buffer layer 18, includes a first absorber layer 22 and a second absorber layer 24. In one embodiment, both absorber structure 20 includes tantalum or silicon. In one embodiment, the first absorber layer 22 is approximately 30–100 nanometers, or more preferably approximately 70 nanometers of tantalum silicon nitride (TaSiN) and the second absorber layer 24 is approximately 10–30 nanometers or more preferably approximately 18 nanometers of tantalum silicon oxide (TaSiO). The first absorber layer 22 and the second absorber layer 24 may be formed by physical vapor deposition (PVD), ion sputtering, the like, or combinations of the above. Additionally, other materials may be used such as TaBN, TaSi, TaN, Ta and the like. The use of two layers for the absorber structure 20 provides for inspection contrast after an overlying bilayer hardmask (discussed below) is removed. Therefore, it is the overlying layers (e.g., a first photoresist 32 and the bilayer hardmask 26) should be completely removed where needed.

The bilayer hardmask 26 is formed over the absorber structure 20 and includes a first hardmask layer 28 and a second hardmask layer 30. The first hardmask layer 28 may be a sacrificial layer of carbon. Carbon has a high selectivity to the desired materials of SiON and SiN for the second hardmask layer 30 and the tantalum-containing materials used for second absorber layer 24. Furthermore, carbon is desirable because it is easy to remove after the (sacrificial) layer is no longer need by exposing the carbon to an oxygen ($O_2$) plasma. In one embodiment, the first hardmask layer 28 is approximately 70 to 100 nanometers of carbon, or more preferably is approximately 80 nanometers of carbon. The first hardmask layer 28 may be formed by physical vapor deposition (PVD), such as sputtering, PECVD, the like or combinations of the above.

The second hardmask layer 30 preferably includes silicon, oxygen, nitrogen, or any combination of at least two of them. Thus, in one embodiment, the second hardmask layer 30 includes silicon dioxide ($SiO_2$), silicon nitride ($Si_3N_4$ or $Si_xN_y$), silicon oxynitride (SiON), or silicon carbon nitride (SiCN). The second hardmask layer 30 may be deposited by PECVD, the like and combinations of the above.

The second hardmask layer 30 is translucent to the radiation to which the mask 10 is exposed because it is thinner than that minimum thickness that can be used for an anti-reflective coating (ARC) in any lithographic process. The reflective properties of an ARC depend on the thickness of a material, not the material itself. For example, a material, such as SiON, can be an ARC if the thickness of the layer is appropriate to the wavelength being used. If the SiON layer has a thickness below that required, then the SiON is not an ARC although it could be an ARC if it was made thicker. To be an ARC the thickness must be at least ¼ of the wavelength of the radiation to which the ARC is exposed. The shortest wavelength being used for inspection is approximately 193 nanometers and approximately ¼ of such a wavelength is approximately 50 nanometers. Thus, a layer must be at least approximately 50 nanometers to be an ARC layer for 193 nanometer lithography. Any other lithographic process will have a greater wavelength and thus to be an ARC for any lithographic process the thickness must be greater than approximately 50 nanometers. For example, for 248 nanometer lithography, an ARC layer must be approximately 60 nanometers thick. The second hardmask layer 30 is no greater than approximately 20 nanometers and is preferably, approximately 10 to 20 nanometers. Thus, an ARC layer is more than twice the thickness of the second hardmask layer 30. In other words, the second hardmask layer 30 is much too thin to be an ARC for any lithographic process.

Additionally, the layers formed over the reflective layer 14 can be formed by any process performed at a temperature less than approximately 150 degrees Celsius in order to not cause interdiffusion within the reflective layer 14 resulting in degradation of the reflective properties of the multilayers.

Figure 2:
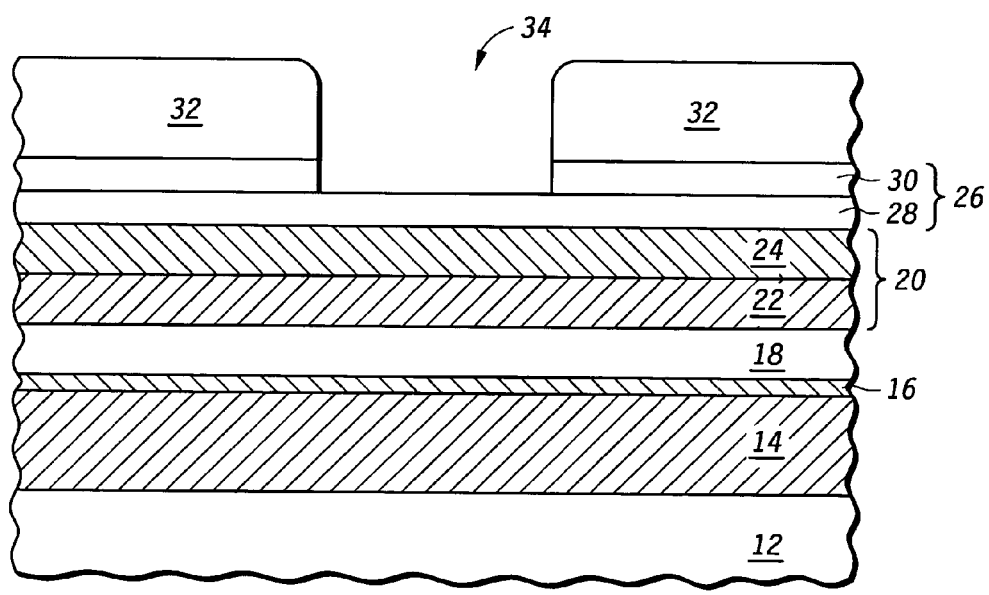
FIG. 2 illustrates the mask of FIG. 1 after patterning a (photo)resist and forming an opening in a portion of the bilayer hardmask in accordance with an embodiment of the present invention.

A first photoresist 32 is formed and patterned over the mask 10 to form, in one embodiment an opening. In one embodiment, the thickness of the photoresist is very thin, such as 50–100 nanometers. As shown in FIG. 2, the opening formed in the first photoresist 32 is transferred to the second hardmask layer 30 as second opening 34. In one embodiment, the second hardmask layer 30 is SiON and is etched using $CHF_3$ chemistry, which will etch the SiON approximately seven times faster than the first photoresist 32. In other words, the SiON to first photoresist 32 is about 7:1 when using $CHF_3$ chemistry.

Figure 3:
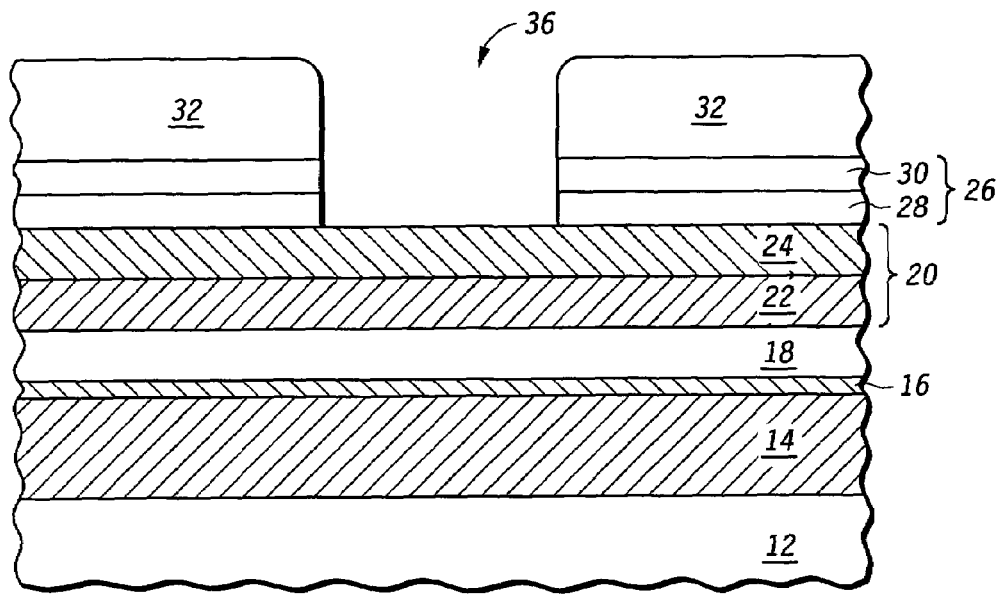
FIG. 3 illustrates the mask of FIG. 1 after transferring the opening into another portion of the bilayer hardmask in accordance with an embodiment of the present invention.

As illustrated in FIG. 3, the first opening 34 is transferred to the first hardmask layer 28 to form a second opening 36. In one embodiment, an oxygen chemistry (e.g., $O_2$) is used to etch the first hardmask layer 28 if it is carbon. Oxygen has a selectivity of greater than approximately 200 to 1 of carbon to SiON.

Figure 4:
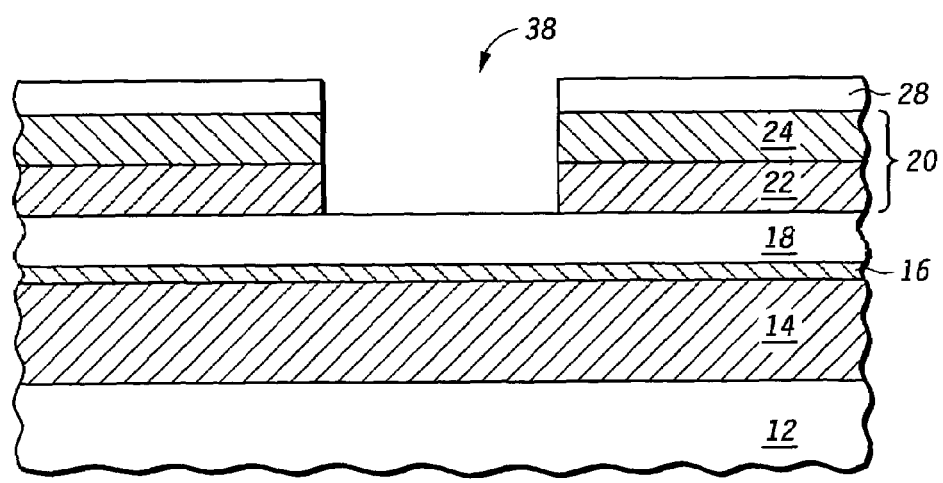
FIG. 4 illustrates the mask of FIG. 3 after transferring the opening into an absorber structure in accordance with an embodiment of the present invention.

The second opening 36 is transferred to the absorber structure 20 to form the third opening 38, as shown in FIG. 4. A chlorine chemistry (e.g., $Cl_2$) can be used to form the third opening 38. $Cl_2$ has an etch selectivity of approximately 0.44 to 1 of TaSiO to carbon and approximately 9 to 1 of TaSiN to carbon.

Figure 5:
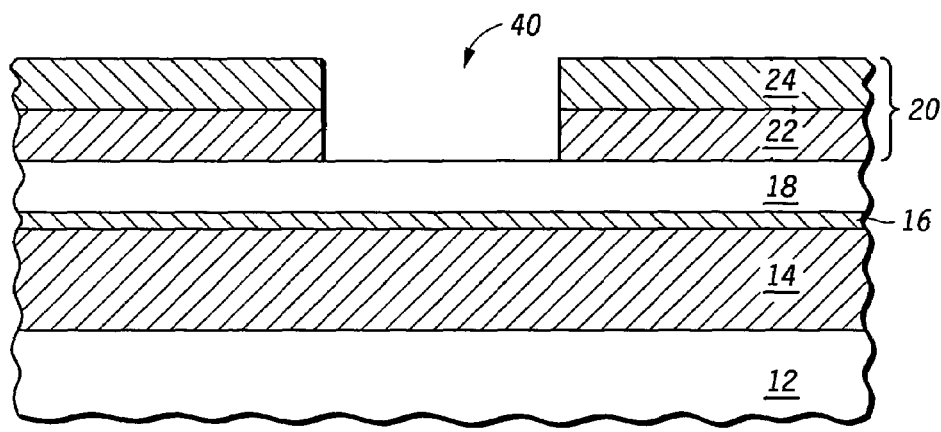
FIG. 5 illustrates the mask of FIG. 4 after removing the photoresist and the bilayer hardmask in accordance with an embodiment of the present invention.
Figure 6:
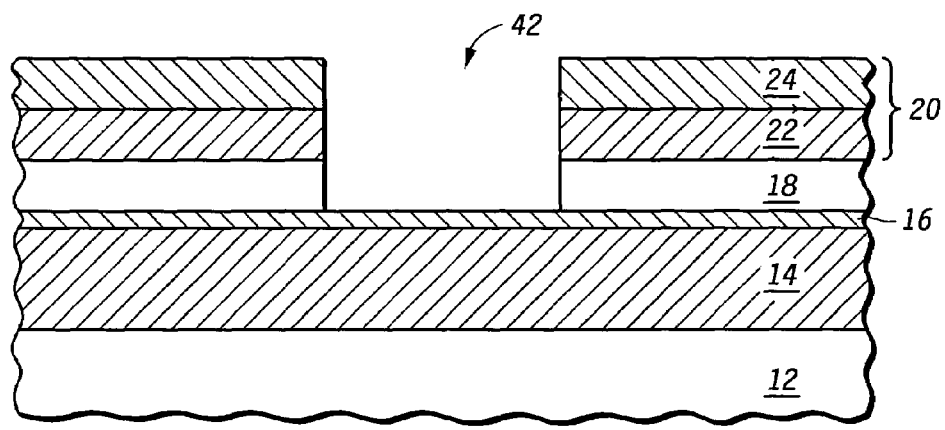
FIG. 6 illustrates the mask of FIG. 5 after transferring the opening to the repair buffer layer in accordance with an embodiment of the present invention.

After patterning the absorber structure 20, in one embodiment, the layer 32 and layer 30, the second hardmask, are completely consumed leaving only the first hardmask layer 28. An oxygen chemistry (e.g., $O_2$) is used to remove the first hardmask layer 28 (e.g., carbon), as shown in FIG. 5. The resulting opening is a fourth opening 40. The SiON layer ranges from 5 nm to 20 nm and the carbon layer ranges from 50 nm to 100 nm. In one embodiment, the thickness of the SiON layer is approximately 10 nm and the thickness of the carbon layer was approximately 80 nm.

After removing the bilayer hardmask 26, a defect inspection and optional, repair processes are performed using the buffer layer 18. The absorber structure 20 may be inspected using light with a deep ultra-violet wavelength, which is between approximately 365 nm and 193 nm. The absorber structure 20 is compared to a desired pattern to determine if any portions of the absorber structure 20 are undesirably added or missing. If any defects are found, the absorber structure 20 is repaired by either removing portions of the absorber structure 20 or adding a metal, such as tantalum, tungsten, platinum, or the like, using a focused ion beam (FIB) or an electron beam to match the desired pattern. Thus, after defect inspection and repair, if performed, the absorber structure 20 may include an additional metal, if added. The buffer layer 18 is etched selective to the absorber structure 20, especially the second absorber layer 24, which is the exposed layer or top most layer of the mask 10 at this point in processing, to form the fifth opening 42. A fluorine-based chemistry, such as $CBF_3$, may be used as it has a selectively of approximately 15 to 1 of SiON to TaSiO. A wet or dry etch, such as a plasma etch, can be used.

Figure 7:
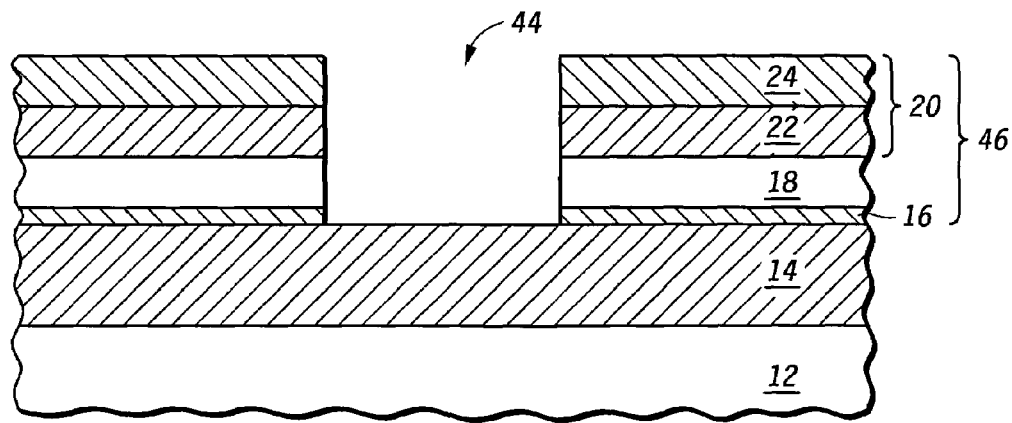
FIG. 7 illustrates the mask of FIG. 6 after transferring the opening through the etch stop layer and exposing the reflective stack in accordance with an embodiment of the present invention.

As shown in FIG. 7, the fifth opening 42 is transferred to the ESL 16 to form the sixth opening 44. In one embodiment, the ESL 16 is etched using $Cl_2$ and $O_2$ because the combination has a selectivity of approximately 50 to 1 of Cr to TaSiO, the exposed layer.

After forming the sixth opening 44, a final inspection is performed. The final inspection is performed in the same manner as the initial inspection using deep ultraviolet (DUV) wavelengths. The inspection verifies the pattern (e.g., the sixth opening 44) is correct without defects being added during the repair process or final etch processes. If the mask fails the final inspection, it likely will need to be scrapped unless the defect is a particle sitting on the surface that can be removed by cleaning. Currently, there is not a method to repair the mask at the final processing stage.

Figure 8:
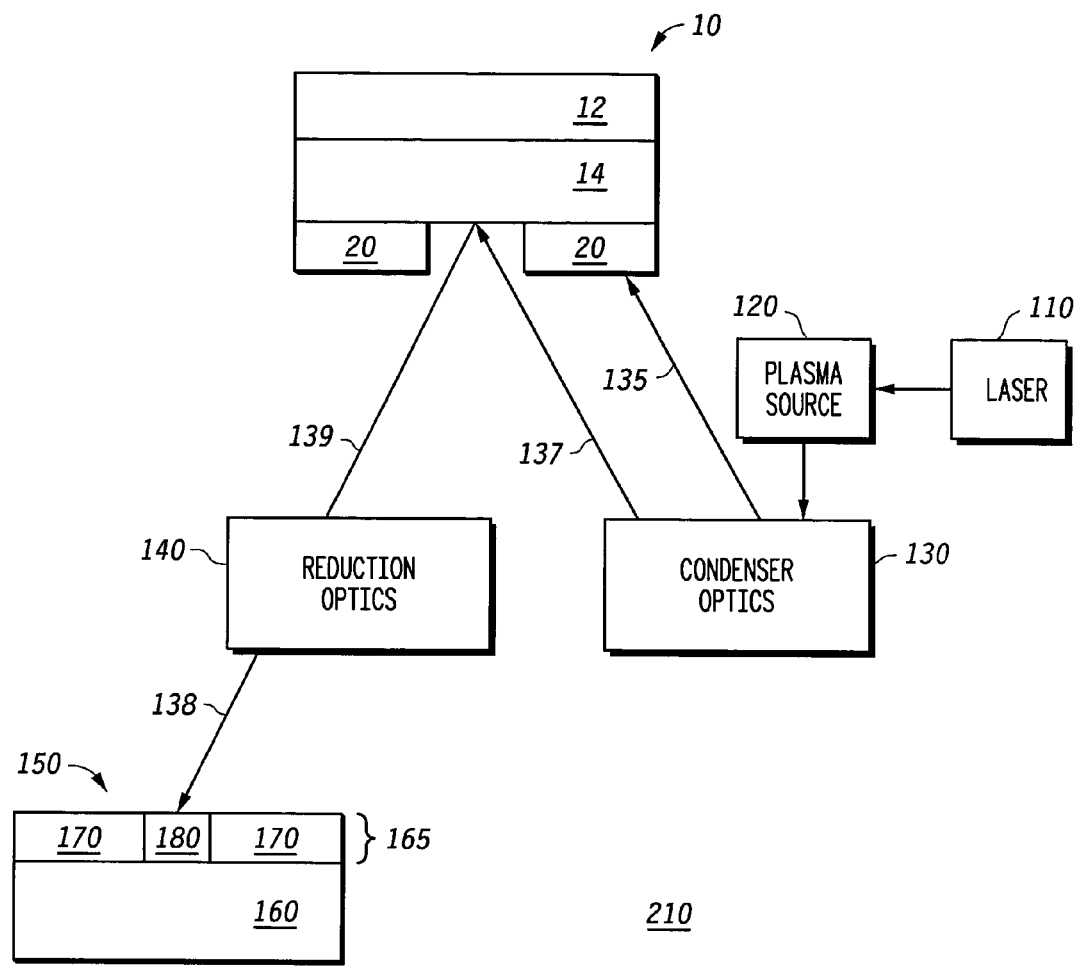
FIG. 8 illustrates using the mask of FIG. 7 to manufacture a semiconductor device in accordance with an embodiment of the present invention.

Shown in FIG. 8 is one embodiment of a photolithographic system 210 for using the mask 10 to pattern a semiconductor wafer or device 150. The photolithographic system 210 includes a laser 110, a plasma source 120, condenser optics 130, the mask 10, reduction optics 140 and the semiconductor device 150.

Although a variety of sources can provide EUV radiation, a laser produced plasma source 120 is shown. The source uses a high powered pulsed laser 110, such as Nd:YAG, for activating a supersonic gas jet, such as xenon gas jet. The xenon atomic clusters are heated to high temperatures resulting in the formation of a plasma source 120. From the plasma source 120 radiation with a wavelength in the EUV regime is emitted and focused by the condenser optics 130 into collimated light or radiation 135 and 137. The collimated light 137 is projected onto the mask 10 at an angle, which is typically approximately 5 degrees with respect to the perpendicular axis of the mask 10, and reflected off of the reflective layer 14 as reflected light 139. The collimated light 135 is projected onto a portion of the absorber structure 20. The reflected light 139 travels through reduction optics 140, which reflect the light in order to shrink the pattern on the mask 10, to become altered light 138. Typically, the reduction optics 140 reduces the pattern on the mask 10 by four or five times. From the reduction optics 140, the altered light 138 illuminates a second photoresist 165 on the semiconductor device 150. The semiconductor device 150 includes the second photoresist 165 and a semiconductor substrate 160, which is preferably monocrystalline silicon, but can be any other semiconductor material such as gallium arsenide, germanium, and the like. The semiconductor substrate 160 may have any number of layers or structures formed within the semiconductor substrate 160 or under the second photoresist 165. If the second photoresist 165 is positive, the altered light 138 will expose a first area 180 and will not expose second areas 170 of the photoresist. If negative photoresist is used, the opposite scenario will occur.

Using the bilayer hardmask 26 allows for a thinner photoresist to be used to pattern an underlying absorber structure 20 and thus, high aspect ratio features to be formed within the absorber structure 20. If the first hardmask layer 28 is carbon, the first hardmask layer 28 is easy to remove using oxygen and has a high selectivity to SiON and SiN, which may be used for the second hardmask layer 30, and materials including tantalum that may be used for the absorber structure 20. In addition, the presence of the first hardmask layer 28 allows for the material chosen for the second hardmask layer 30 to not have to be etched using a chemistry that is selective to the material(s) used for the absorber structure 20.

For example, SiON cannot be etched selective to Ta-containing materials that may be used for the absorber structure 20 and the underlying buffer layer 18 if it is SiON. However, carbon can be etched selective to both SiON and Ta-containing materials and thus, the presence of the carbon layer allows for the SiON to be used as a hardmask for the first photoresist 32.

By using the bilayer hardmask 26, as discussed above, the photoresist is less likely to collapse due to high aspect ratio features. In addition, veil formation is less problematic. Veils are often formed when Ta-containing materials are etched.

When etching the Ta-containing material, Ta by-products deposit on the sidewalls of features in the photoresist creating thin veils of metallic material attached to the openings in photoresist. When the photoresist is removed, the veils undesirably remain. By using a thinner resist, the amount of sidewall area for the formation of veils is reduced when using the bilayer hardmask 26. Thus, less veils are formed. Furthermore, the bilayer hardmask 26 is desirable because it can easily be removed, allowing for the ability to inspect the mask 10 for defects, and correct, if necessary.

The mask 10 manufactured using the bilayer hardmask 26 is especially useful for advanced optical and extreme ultraviolet (EUV) lithography for sub-45 nanometer device fabrication.

In the foregoing specification, the invention has been described with reference to specific embodiments. However, one of ordinary skill in the art appreciates that various modifications and changes can be made without departing from the scope of the present invention as set forth in the claims below. For example, other suitable materials and etching chemistries may be used. In addition, the openings in the figures are just one example of a pattern and any pattern can be used. Accordingly, the specification and figures are to be regarded in an illustrative rather than a restrictive sense, and all such modifications are intended to be included within the scope of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of patterning a first resist on a semiconductor wafer using a mask, the method comprising:
   providing a semiconductor substrate having a plurality of semiconductor die;
   forming a first resist over the semiconductor substrate;
   reflecting radiation off of the mask to create reflected radiation, wherein the mask comprises:
   providing a substrate;
   forming a reflective stack over the substrate;
   forming an absorber over the reflective stack;
   forming a first hardmask layer over the absorber, wherein the first hardmask layer comprises carbon;
   forming a second hardmask layer over the first hardmask layer, wherein the second hardmask layer has a thickness no greater than approximately 20 nanometers;
   forming a second resist over the second hardmask layer;
   patterning the second resist to form a first pattern;
   transferring the first pattern from the second resist to the second hardmask layer and the first hardmask layer;
   removing the second resist;
   transferring the first pattern from the first hardmask layer and the second hardmask layer to the absorber; and
   removing the first hardmask layer and the second hardmask layer; and exposing the first resist to the reflected radiation to form a second pattern in the first resist.

2. The method of claim 1, wherein the forming the second hardmask layer over the first hardmask layer further comprises forming the second hardmask layer, wherein the second hardmask layer comprises silicon.

3. The method of claim 2, wherein the forming the second hardmask layer over the first hardmask layer further comprises forming the second hardmask layer, wherein the second hardmask layer further comprises oxygen.

4. The method of claim 2, wherein the forming the second hardmask layer over the first hardmask layer further comprises forming the second hardmask layer, wherein the second hardmask layer further comprises nitrogen.

5. The method of claim 2, wherein the forming the second hardmask layer over the first hardmask layer further comprises forming the second hardmask layer, wherein the second hardmask layer further comprises silicon and nitrogen.

6. The method of claim 1, wherein the forming the second hardmask layer over the first hardmask layer further comprises forming the second hardmask layer, wherein the second hardmask layer comprises a material selected from the group consisting of silicon dioxide, silicon nitride, and silicon oxynitride.

7. The method of claim 1, wherein the forming the second hardmask layer over the first hardmask layer further comprises forming the second hardmask layer, wherein the second hardmask layer is substantially translucent to the reflected radiation.

8. A method of patterning a first resist on a semiconductor wafer using a mask, the method comprising:
providing a semiconductor substrate having a plurality of semiconductor die;
forming a first resist over the semiconductor substrate;
reflecting radiation off of the mask to create reflected radiation, wherein the mask comprises:
providing a substrate;
forming a reflective stack over the substrate;
forming an absorber over the reflective stack;
forming a first hardmask layer over the absorber, wherein the first hardmask layer comprises carbon;
forming a second hardmask layer over the first hardmask layer, wherein the second hardmask layer is substantially translucent to the reflected radiation;
forming a second resist over the second hardmask layer;
patterning the second resist to form a first pattern;
transferring the first pattern from the second resist to the second hardmask layer and the first hardmask layer;
removing the second resist;
transferring the first pattern from the first hardmask layer and the second hardmask layer to the absorber; and
removing the first hardmask layer and the second hardmask layer; and
exposing the first resist to the reflected radiation to form a second pattern in the first resist.

9. The method of claim 8, wherein the forming the second hardmask layer over the first hardmask layer further comprises Forming the second hardmask layer, wherein the second hardmask layer comprises silicon.

10. The method of claim 9, wherein the forming the second hardmask layer over the first hardmask layer further comprises forming the second hardmask layer, wherein the second hardmask layer further comprises oxygen.

11. The method of claim 9, wherein the forming the second hardmask layer over the first hardmask layer further comprises forming the second hardmask layer, wherein the second hardmask layer further comprises nitrogen.

12. The method of claim 9, wherein the forming the second hardmask layer over the first hardmask layer further comprises forming the second hardmask layer, wherein the second hardmask layer further comprises silicon and nitrogen.

13. The method of claim 8, wherein the forming the second hardmask layer over the first hardmask layer further comprises forming the second hardmask layer, wherein the second hardmask layer comprises a material selected from the group consisting of silicon dioxide, silicon nitride, and silicon oxynitride.

14. The method of claim 8, wherein the forming the second hardmask layer over the first hardmask layer further comprises Penning the second hardmask layer, wherein the second hardmask layer comprises a thickness no greater than approximately 20 nanometers.

15. A method for fabricating a mask, the method comprising:
providing a substrate;
forming a reflective stack over the substrate;
forming an absorber over the reflective stack;
forming a first hardmask layer over the absorber, wherein the first hardmask layer comprises carbon;
forming a second hardmask layer over the first hardmask layer, wherein the second hardmask layer is substantially translucent to the reflected radiation;
forming a second resist over the second hardmask layer;
patterning the second resist to form a first pattern;
transferring the lint pattern from the second resist to the second hardmask layer and the first hardmask layer;
removing the second resist;
transferring the first pattern from the first hardmask layer and the second hardmask layer to the absorber; and
removing the first hardmask layer and the second hardmask layer.

16. The method of claim 15, wherein the forming the second hardmask layer over the first hardmask layer further comprises forming the second hardmask layer, wherein the second hardmask layer comprises silicon.

17. The method of claim 16, wherein the forming the second hardmask layer over the first hardmask layer further comprises forming the second hardmask layer, wherein the second hardmask layer further comprises oxygen.

18. The method of claim 16, wherein the forming the second hardmask layer over the first hardmask layer further comprises forming the second hardmask layer, wherein the second hardmask layer further comprises nitrogen.

19. The method of claim 16, wherein the forming the second hardmask layer over the first hardmask layer further comprises forming the second hardmask layer, wherein the second hardmask layer further comprises silicon and nitrogen.

20. The method of claim 15, wherein the Forming the second hardmask layer over the first hardmask layer further comprises forming the second hardmask layer, wherein the second hardmask layer comprises a thickness no greater than approximately 20 nanometers.

* * * * *

UNITED STATES PATENT AND TRADEMARK OFFICE
CERTIFICATE OF CORRECTION

| | | |
|---|---|---|
| PATENT NO. | : 7,074,527 B2 | Page 1 of 1 |
| APPLICATION NO. | : 10/668432 | |
| DATED | : September 23, 2003 | |
| INVENTOR(S) | : Bing Lu | |

It is certified that error appears in the above-identified patent and that said Letters Patent is hereby corrected as shown below:

In Column 7, Line 62, Claim No. 9:

Change "prises Forming the second hardmask" to --prises forming the second hardmask--

In Column 8, Line 20, Claim No. 14:

Change "comprises Penning the second hardmask" to --comprises forming the second hardmask--

In Column 8, Line 35, Claim No. 15:

Change "transferring the lint pattern from" to --transferring the first pattern from--

In Column 8, Line 59, Claim No. 20:

Change "wherein the Forming the" to --wherein the forming the--

Signed and Sealed this

Twenty-seventh Day of May, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,074,527 B2 | Page 1 of 1 |
| APPLICATION NO. | : 10/668432 | |
| DATED | : July 11, 2006 | |
| INVENTOR(S) | : Bing Lu | |

It is certified that error appears in the above-identified patent and that said Letters Patent is hereby corrected as shown below:

In Column 7, Line 62, Claim No. 9:

Change "prises Forming the second hardmask" to --prises forming the second hardmask--

In Column 8, Line 20, Claim No. 14:

Change "comprises Penning the second hardmask" to --comprises forming the second hardmask--

In Column 8, Line 35, Claim No. 15:

Change "transferring the lint pattern from" to --transferring the first pattern from--

In Column 8, Line 59, Claim No. 20:

Change "wherein the Forming the" to --wherein the forming the--

This certificate supersedes the Certificate of Correction issued May 27, 2008.

Signed and Sealed this

Twenty-fourth Day of June, 2008

JON W. DUDAS
*Director of the United States Patent and Trademark Office*